United States Patent

Kitajima et al.

[11] Patent Number: 6,107,181
[45] Date of Patent: Aug. 22, 2000

[54] METHOD OF FORMING BUMPS AND TEMPLATE USED FOR FORMING BUMPS

[75] Inventors: Masayuki Kitajima; Yutaka Noda; Yoshitaka Muraoka, all of Kawasaki, Japan

[73] Assignee: Fujitsu Limited, Kawasaki, Japan

[21] Appl. No.: 09/015,265

[22] Filed: Jan. 29, 1998

[30] Foreign Application Priority Data

Sep. 8, 1997 [JP] Japan ................................. 9-242879

[51] Int. Cl.⁷ .................................................. H01L 21/44
[52] U.S. Cl. ........................ 438/616; 438/612; 438/613; 438/614; 228/180.21; 228/180.22; 29/840
[58] Field of Search ................................... 438/612, 613, 438/614, 616; 228/254, 253, 180.22, 180.21; 427/96, 123; 29/840, 740

[56] References Cited

U.S. PATENT DOCUMENTS

| | | | |
|---|---|---|---|
| 5,284,287 | 2/1994 | Wilson et al. | 228/180.2 |
| 5,516,032 | 5/1996 | Sakemi et al. | 228/246 |
| 5,601,229 | 2/1997 | Nakazato et al. | 288/246 |
| 5,695,667 | 12/1997 | Eguchi et al. | 219/388 |
| 5,788,143 | 8/1998 | Boyd et al. | 228/253 |
| 5,878,943 | 3/1999 | Nishikawa et al. | 228/205 |
| 5,890,283 | 4/1999 | Sakemi et al. | 29/840 |
| 5,976,965 | 11/1999 | Takahashi et al. | 438/616 |

FOREIGN PATENT DOCUMENTS

| | | |
|---|---|---|
| 62-25435 | 2/1987 | Japan . |
| 64-45150 | 2/1989 | Japan . |
| 64-73625 | 3/1989 | Japan . |
| 2-30390 | 1/1990 | Japan . |
| 2-182390 | 7/1990 | Japan . |
| 4-65130 | 3/1992 | Japan . |
| 4-69945 | 3/1992 | Japan . |
| 4-75357 | 3/1992 | Japan . |
| 5-129374 | 5/1993 | Japan . |
| 5-299424 | 11/1993 | Japan . |
| 8-18209 | 1/1996 | Japan . |
| 8-112671 | 5/1996 | Japan . |
| 8-118005 | 5/1996 | Japan . |
| 8-141765 | 6/1996 | Japan . |
| 9-64048 | 3/1997 | Japan . |
| 9-270429 | 10/1997 | Japan . |
| 9-298355 | 11/1997 | Japan . |
| 9-298356 | 11/1997 | Japan . |

OTHER PUBLICATIONS

Office Action of Japanese Patent Application No. 10–110869 dated Jan. 5, 1999 with translation.

Office Action of Japanese Patent Application No. 10–110869 dated Aug. 18, 1998 with Translation.

*Primary Examiner*—John F. Niebling
*Assistant Examiner*—David A Zarneke
*Attorney, Agent, or Firm*—Armstrong, Westerman, Hattori, McLeland & Naughton

[57] ABSTRACT

A method of manufacturing a template having through-holes for attracting and supporting electrically conductive balls by vacuum suction is disclosed. The through-holes are formed by etching and the side walls of the through-holes are smoothed by irradiation, with laser beams, of the side walls of the through-holes. A template and metallic bumps can be formed using this method. Alternatively, the template can be formed in a two-layered structure.

9 Claims, 7 Drawing Sheets

METHOD OF FORMING BUMPS AND TEMPLATE USED FOR FORMING BUMPS

BACKGROUND OF THE INVENTION

1. Field of the Invention

The present invention relates to a method of forming bumps used for forming conductive bumps in electronic parts. Also, the present invention relates to a template used in the bump forming method and a method of manufacturing the template.

2. Description of the Related Art

A method of forming metallic bumps such as solder bumps on an electronic part such as an LSI and joining the electronic part to a printed circuit board by the metallic bumps has come into wide use. In one method of forming the metallic bumps, metallic balls are previously formed and stored in a metallic ball container, and then the metallic balls are taken out from the metallic ball container and attached to the electrodes of the electronic part so that the metallic balls can be used as metallic bumps of the electronic part. For example, Japanese Unexamined Patent publication No. 8-112671 discloses the above-described metallic bump forming apparatus.

In the conventional metallic bump forming apparatus, a suction head is used to take out the metallic balls from the metallic ball container and attach them to the electrodes of electronic part. A template (suction pad) for mounting metallic balls is attached to the suction head, the template having through-holes arranged in the same arrangement as that of the electrodes of the electronic part. Suction grooves are provided in the surface of the sucking head and connected to a vacuum source, and the through-holes of the template for mounting metallic balls are connected to the suction grooves of the suction head, so that the metallic balls can be attracted by vacuum suction.

When the template for mounting metallic balls comes into contact with the metallic balls accommodated in the metallic ball container, the metallic balls are respectively sucked by and attracted to the through-holes in the template. When the suction head is then moved above the electronic part, the metallic balls attracted to the through-holes in the template are respectively located on the electrodes of the electronic part. Then, the metallic balls are joined to the electrodes of the electronic part under heat and pressure, the metallic balls becoming the metallic bumps. After that, the suction head is separated from the electronic part, with the result that the metallic balls are transferred from the suction head to the electronic part.

The template for mounting metallic balls is usually made of inorganic material such as glass, which is resistant to distortion, and its charging level is low. Plastics are not suitable for the material for the template for mounting metallic balls, because plastics are easily distorted, and their charging level is high. If the template for mounting metallic balls is made of a plate which is easily distorted, the template is distorted and the positions of the through-holes are shifted from the positions of the electrodes of the electronic parts, when the metallic balls are bonded to the electrodes of the electronic part under heat and pressure by means of thermo-compression. When the template for mounting metallic balls has an electrification property, the metallic balls are attracted to the template at positions other than those of the through-holes by static electricity when the template is moved above and then into the metallic ball container to suck the metallic balls to the through-holes.

Through-holes in the template for mounting metallic balls are formed by etching. Alternatively, the through-holes can be formed by machining such as drilling or electric discharge machining. However, when the template for mounting metallic balls is made of inorganic material such as glass, the side walls of the through-holes become unsmooth, and there is a possibility of generation of burrs which is an irregularity of the side walls of the through-holes.

If the side walls of the through-holes are not smooth, the following problems may be caused. The metallic balls bite into the end portions of the through-holes in the template for mounting metallic balls when the template is pressed against the electronic part to join the metallic balls to the electrodes of the electronic part, and the metallic balls adhere to the template and the metallic balls are torn off from the electrodes of the electronic part, when the suction head is separated from the electronic part.

SUMMARY OF THE INVENTION

The object of the present invention is to provide a method of forming bumps, a template for mounting metallic balls capable of reliably joining the metallic balls to the electrode pads of an electronic part and a method of manufacturing the template.

A method of forming bumps onto a chip having electrodes, according to the present invention, comprises the steps of using a template having through-holes with smoothed side walls formed corresponding to the electrodes of the chip, to attract conductive balls to be formed into bumps by vacuum suction, positioning the conductive balls attracted by the template to the electrodes, pressing the conductive balls against the electrodes by the template, and releasing vacuum suction.

A method of manufacturing a template, according to the present invention comprises the steps of: forming through-holes in a plate for attracting and supporting conductive balls thereat, and smoothing the side walls of the through-holes formed in the through-hole forming step.

Preferably, the through-holes are formed by etching the template. Preferably, the side walls are smoothed by irradiating the template with laser beams. Also, preferably, the step of irradiating the template with laser beams comprising irradiating the side walls of the through-holes with laser beams via a mask having openings, the size of which is a little larger than the diameter of each through-hole.

A template, according to the present invention comprises through-holes for attracting and supporting conductive balls by vacuum suction, the through-holes having smoothed side walls.

In this structure, the side walls of the through-holes in the template are smoothed by irradiating the side walls with laser beams. Accordingly, the conductive balls do not bite into the end portions of the through-holes in the template, and, when the suction head is separated from the electronic part after the conductive balls have been joined to the electrode pads of the electronic part, the conductive balls are surely separated from the template and the conductive balls are reliably joined to the electrode pads of the electronic part.

Further, the present invention provides a template comprising an inorganic material layer and an organic material layer laminated on each other, said template having through-holes formed through the inorganic and the organic material layer for attracting and supporting conductive balls.

In this structure, the inorganic material layer gives a sufficiently high mechanical strength to the template to resist distortion. The through-holes are provided through the inorganic and the organic layer, and the portion of the through-holes in the organic material layer can be more smoothly formed than the portion of the through-holes on the inorganic material layer. The conductive balls are sucked and attracted by the portion of the through-holes formed in the organic material layer. Accordingly, the conductive balls do not bite into the end portions of the through-holes in the template, and, when the suction head is separated from the electronic part after the conductive balls have been joined to the electrode pads of the electronic part, the conductive balls are surely separated from the template and the conductive balls are reliably joined to the electrode pads of the electronic part.

Further, the present invention provides a template comprising an air permeable material layer and a resin layer laminated on each other, said template having through-holes formed through the resin layer.

The air permeable material layer allows communication between the suction groove of the suction head and the through-holes in the resin layer, and the through-holes can suck and attract the conductive balls. In this case too, the conductive balls do not bite into the end portions of the through-holes in the template, and when the conductive balls are joined to the electrode pads of the electronic part and thereafter the suction head is separated from the electronic part, the conductive balls are surely separated from the template and the conductive balls can be reliably joined to the electrode pads of the electronic part.

BRIEF DESCRIPTION OF THE DRAWINGS

The present invention will become more apparent from the following description of the preferred embodiments, with reference to the accompanying drawings, in which:

FIGS. 1A and 1B a reviews showing a process of forming the through-holes in the template, according to the first embodiment of the present invention, wherein FIG. 1A is a cross-sectional view showing the template for mounting metallic balls, and FIG. 1B is a plan view showing a through-hole including a resultant burr;

FIGS. 2A and 2B are views showing a process of irradiating the template shown in FIG. 1 with laser beams, wherein FIG. 2A is a cross-sectional view showing the template for mounting metallic balls, and FIG. 2B is a plan view showing a through-hole from which burr has been removed;

DESCRIPTION OF THE PREFERRED EMBODIMENTS

Figure 5:
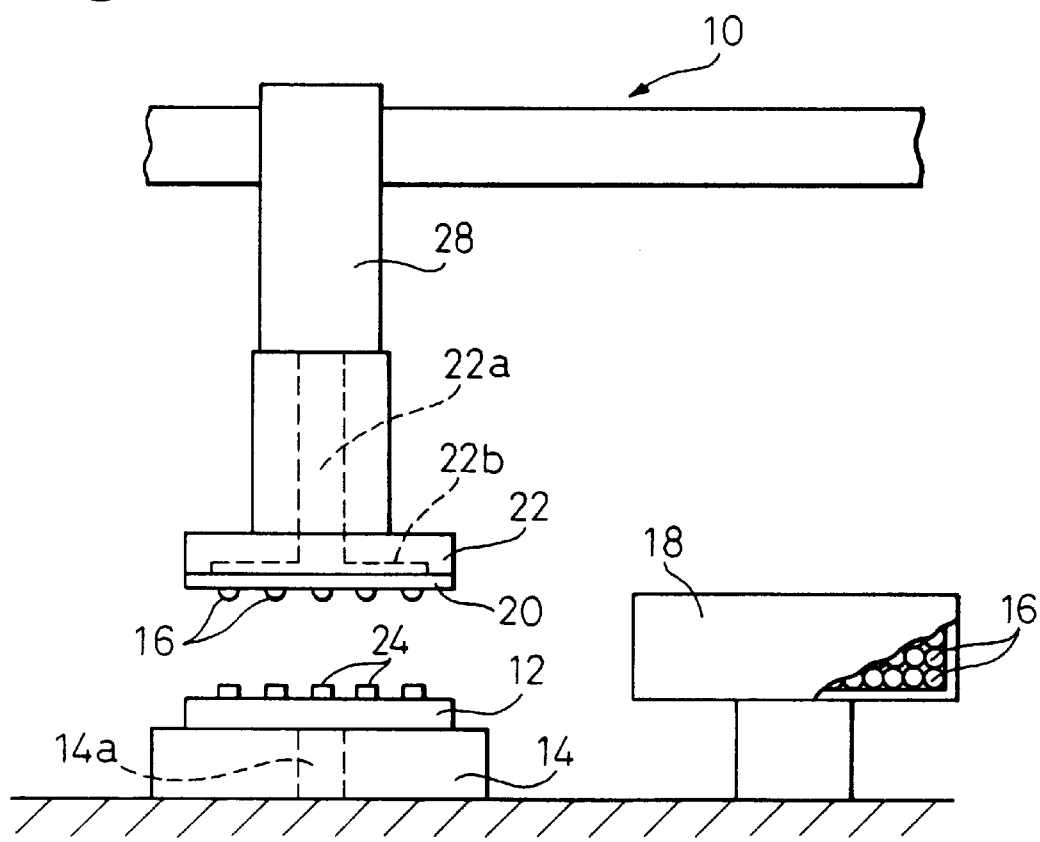
FIG. 5 is a view showing the metallic bump forming apparatus including the template for mounting metallic balls of the present invention.

FIG. 5 shows a metallic bump forming apparatus 10 including a template of the present invention for mounting metallic balls (conductive balls). The metallic bump forming apparatus 10 includes a stage 14 to support an electronic part 12 such as an LSI, a metallic ball container 18 accommodating metallic balls 16 which are previously formed, and a suction head 22 having a template 20 for mounting metallic balls attached thereto.

The stage 14 is provided with a suction hole 14a, so that the electronic part 12 can be held on the stage 14 by the action of a vacuum. The electronic part 12 is provided with electrodes 24 arranged at a predetermined pattern. The suction head 22 is provided with a suction hole 22a and a suction groove 22b.

Figure 6:
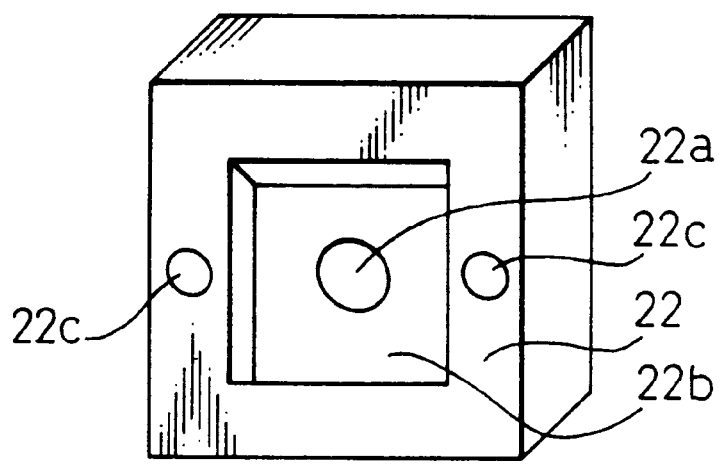
FIG. 6 is a perspective view showing the suction head shown in FIG. 5.

FIG. 6 shows the suction head 22. The suction hole 22a extends in the suction head 22, and the suction groove 22b is formed in the surface of the suction head 22. Also, plate suction holes 22c are open in the surface of the suction head 22.

Figure 7:
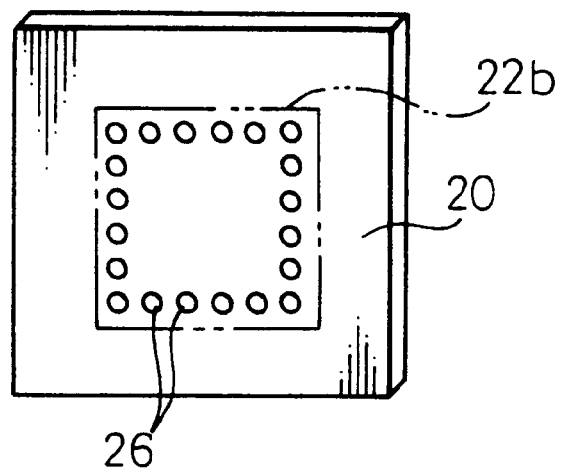
FIG. 7 is a perspective view showing the template shown in FIG. 5 for mounting metallic balls.

FIG. 7 shows the template 20 for mounting metallic balls. The template 20 for mounting metallic balls has through-holes 26. The arrangement of the through-holes 26 is the same as the arrangement of the electrodes 24 of the electronic part 12. According to the type of the electronic part 12, a template 20 having differently arranged through-holes 26 may be prepared. The through-holes 26 are arranged in such a manner that they are located in the range of the suction groove 22b when the template 20 for mounting metallic balls is attracted to the suction head 22 by the plate suction holes 22c. Accordingly, all the through-holes 26 are communicated with the suction groove 22b.

Consequently, it is possible to attract the metallic balls 16 to the through-holes 26 in the template 20 by vacuum suction, as shown in FIG. 5. The metallic bump forming apparatus 10 shown in FIG. 5 further includes a transfer unit 28, so that the suction head 22 can be moved between a position above the metallic ball container 18 and a position above the electronic part 12.

Figure 8A:
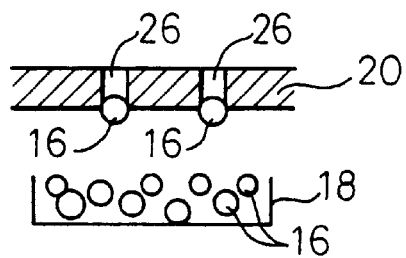
FIGS. 8A to 8E are views showing the operation of the metallic bump forming apparatus.
Figure 8B:
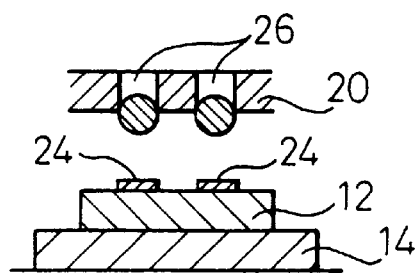
Figure 8C:
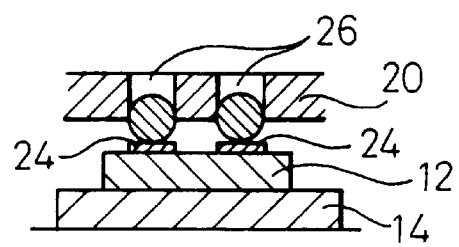
Figure 8D:
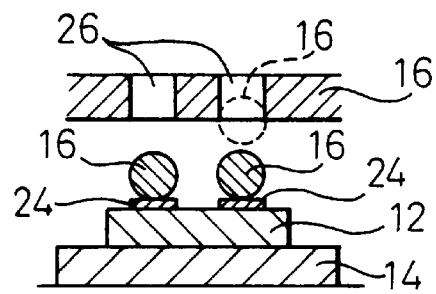
Figure 8E:
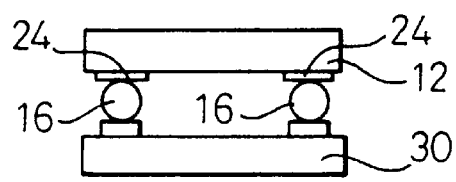

FIGS. 8A to 8E show the operation of the metallic bump forming apparatus 10. FIG. 8A shows a state in which the suction head 22 is moved above the metallic ball container 18 and the metallic balls 16 are attracted to the through-holes 26 in the template 20 by vacuum suction. FIG. 8B shows a state in which the suction head 22 is moved above the electronic part 12 arranged on the stage 14. FIG. 8C shows a state in which the metallic balls 16 are fused to the electrodes 24 of the electronic part 12 under heat and pressure. FIG. 8D shows a state in which the suction head 22 is separated from the electronic part 12. In this case, a vacuum supply to the plate suction holes 22c is continued, and a vacuum supply to the suction hole 22a is stopped. Due to the foregoing, the metallic balls 16 are joined to the electrodes 24 of the electronic part 12 and formed into metallic bumps. After that, it is possible to press the metallic balls 16 against a glass plate so that the metallic balls 16 are leveled, and to apply silver paste to the metallic balls 16. FIG. 8E shows a state in which the electronic part 12 is joined to a printed circuit board 30 by the metallic bumps. In this case, it is possible to bond the electronic part 12 to the printed circuit board 30 with an insulating adhesive.

If the through-holes 26 of template 20 are not smooth, the metallic ball 16 may bite into burr 42 at the end portions of the through-holes 26 when the template 20 is pressed against the electronic part 12, and the metallic ball 16 may be moved together with the template 20 when the suction head 22 is separated from the electronic part 12, as shown in FIG. 8D, resulting in a problem that the metallic ball 16, which had been joined to the electrodes 24 of the electronic part 12, may be peeled off the electrode 24. Therefore, it is preferable that metallic balls 16 do not bite into the end portions of the through-holes 26.

Figure 1A:
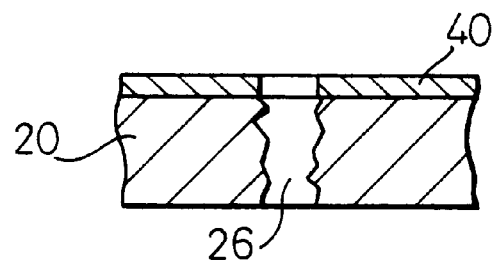
Figure 1B:
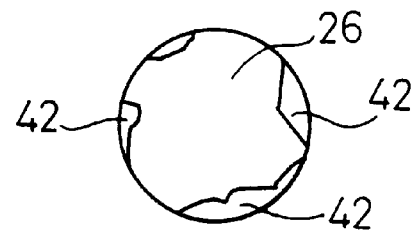

FIGS. 1A to 2B show the first embodiment of the present invention. The template 20 for mounting metallic balls is made of glass which is an inorganic material. In FIG. 1A, a template (glass plate) 20 for mounting metallic balls is subjected to etching to form through-holes 26. In this case, etching is conducted in such a manner that a glass plate with a mask 40 is soaked in the etching liquid containing fluoride. When the through-holes 26 are formed in the glass plate by etching, the side wall of the through-holes 26 become irregular, as shown in FIG. 1(B), that is, burr 42 is formed in the side walls of the through-holes 26.

Figure 2A:
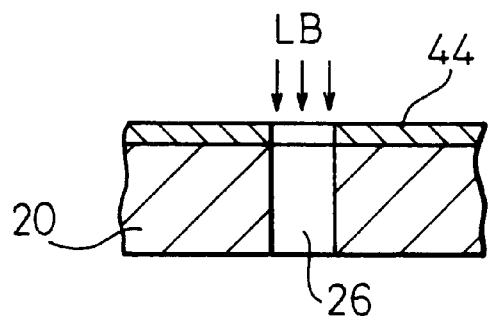
Figure 2B:
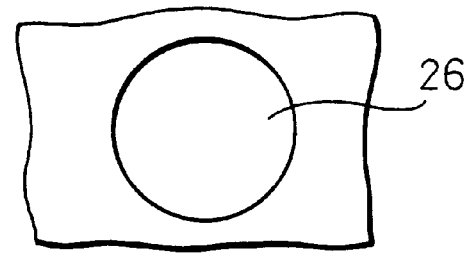

The side walls of the through-holes 26 are then smoothed, by irradiating the side walls of the through-holes with laser beams LB, as shown in FIG. 2A. FIG. 2B diagrammatically shows the through-hole 26 in which the burr 42 is removed from the side wall of the through-hole 26 shown in FIG. 1B and the side wall is smoothed.

It is preferable that only a restricted region in the periphery of the through-hole 26 is irradiated with laser beams LB. If a portion between two adjacent through-holes 26 in the template 20 is excessively irradiated with laser beams LB, a problem occurs that the surface of the template 20 may be deformed. It is preferable to use the excimer laser. An intensity of energy emitted by the YAG laser is so high that it is not appropriate when fine perforation is to be conducted. The $CO_2$ laser is not appropriate for processing a glass plate.

In this example, the template 20 is irradiated with laser beams LB after the mask 44 has been set on it. In the case where the diameter of the through-hole 26 is 24 $\mu$m, the diameter of the opening of the mask 44 is 26 $\mu$m. In other words, it is preferable that laser beams LB is irradiated at a region larger than the diameter of the through-hole 26 by 2 $\mu$m. In this example, the output condition of the laser was as follows: when the thickness of the template 20 is 300 $\mu$m, the output is 300 mJ/200 Hz, and the number of pulses is 1000. Also, krypton gas and fluorine gas are used. In this case, He gas or Ne gas is added as an assist gas. As a pretreatment, carbon (C) is vapor-deposited to the glass plate.

Figure 3:
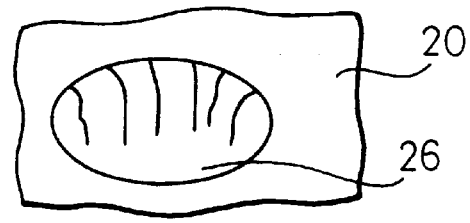
FIG. 3 is a schematic perspective view showing the periphery of the end portion of the through-hole which is smoothed by the irradiation of laser beams.

FIG. 3 shows the end portion (a portion of the through-hole 26 close to the surface of the template 20 for mounting metallic balls) of the through-hole 26 which has been made smooth by the irradiation of laser beams LB. Burr 42 shown in FIG. 1(B) in the through-hole 26 formed when etching is conducted is melted away and the surface of the through-hole 26 becomes smoother. In this connection, a state in which the burr 42 is formed in the through-hole 26 and also a state in which the burr 42 is removed from the through-hole 26, as shown in FIG. 3, can be seen by the microscopic observation and microphotograph.

Figure 4:
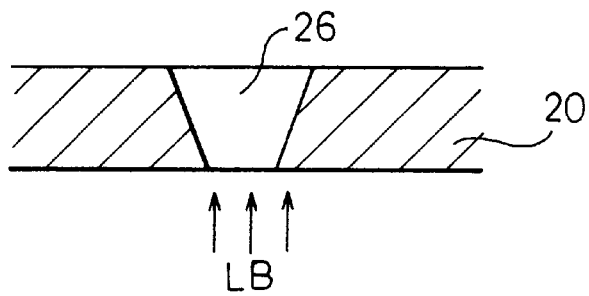
FIG. 4 is a cross-sectional view showing a variation of the template for mounting metallic balls.

In FIG. 1A, the diameter of the through-hole 26 in the template 20 is substantially uniform, but FIG. 4 shows an example in which the through-hole 26 in the template 20 is tapered. When the through-hole 26 is formed in the template 20 by etching, the through-hole 26 is frequently tapered, as shown in FIG. 5. Burrs are caused also in this case too, so the side wall of the through-hole 26 is irradiated with laser beams LB to smooth the side wall of the through-hole. In this case, one end portion of the through-hole 26, the diameter of which is smaller than that of the other end portion, is irradiated with laser beams LB, and in use, this end portion irradiated with laser beams LB is directed toward the metallic ball 16.

In the above example, the through-holes 26 in the template 20 for mounting metallic balls are formed by etching, but it is possible to form the through-holes 26 by machining such as electric discharge drilling, and after the formation of the through-holes 26, they are irradiated with laser beams LB.

Figure 9:
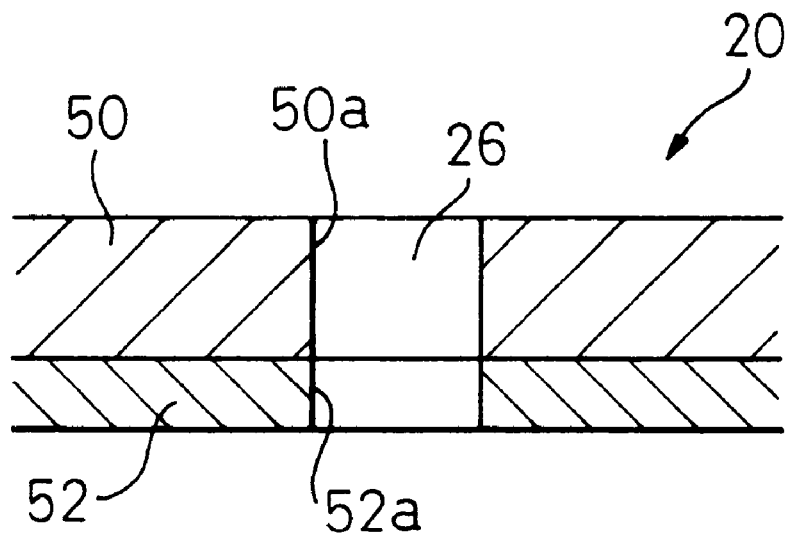
FIG. 9 is a cross-sectional view showing a portion of the template for mounting metallic balls, according to the second embodiment of the present invention.

FIG. 9 shows the second embodiment of the present invention. In this embodiment, the template 20 for mounting metallic balls comprises an inorganic material layer 50 and an organic material layer 52 laminated on each other, and the through-holes (only one shown in FIG. 9) 26 (50a, 52a) to attract and support the metallic balls 16 are formed through the inorganic material layer 50 and the organic material layer 52. The organic material layer 52 is bonded to the inorganic material layer 50 by prepreg or adhesive.

The inorganic material layer 50 comprises a glass plate, and the through-holes 50a are formed by etching. The inorganic material layer 50 provides a necessary high mechanical strength to the template 20 for mounting metallic balls. The organic material layer 52 is made of heat-resistant plastics such as polyimide, fluorine resin of PTFE, and nylon. The smooth through-holes 50a can be easily formed in the organic material layer 52 by laser beam processing, compared with the case in which the through-holes 50a are formed in the inorganic material layer 50. In use, the through-holes 52a are directed to the metallic balls 16.

Accordingly, the mechanical strength of the template 20 comprising the inorganic material layer 50 and the organic material layer 52 is sufficiently high, the metallic balls 16 do not bite into the through-holes 26, and it is possible to reliably form metallic bumps in the electronic part, using this template 20 for mounting metallic balls. In this connection, the inorganic material layer 50 and the organic material layer 52 may be bonded together after the through-holes 50a, 52b have been respectively formed, or alternatively the through-hole 26 may be formed after both layers have been bonded together. The surface of the organic material layer 52 may be coated with a film for preventing the generation of static electricity.

Figure 10:
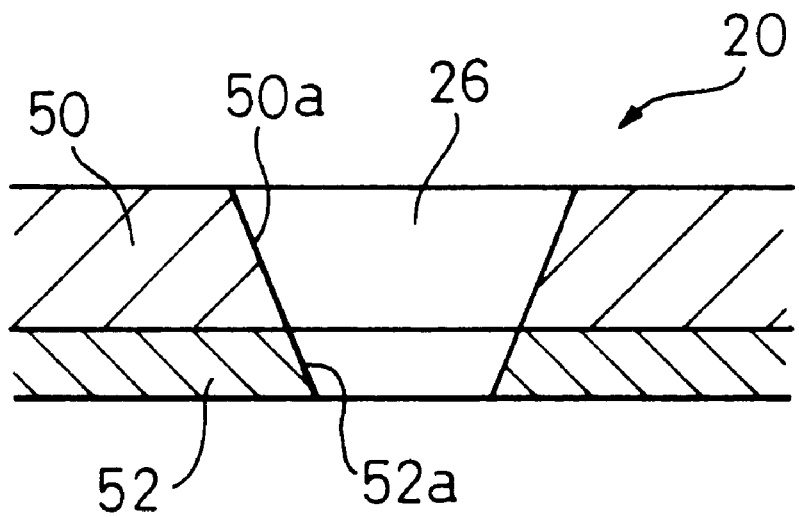
FIG. 10 is a cross-sectional view showing a variation of the template for mounting metallic balls shown in FIG. 9.

FIG. 10 shows a variation of the template 20 shown in FIG. 9. The through-holes 26 in this template 20 are tapered. Except for this point, the template 20 shown in FIG. 10 is the same as that shown in FIG. 9.

Figure 11:
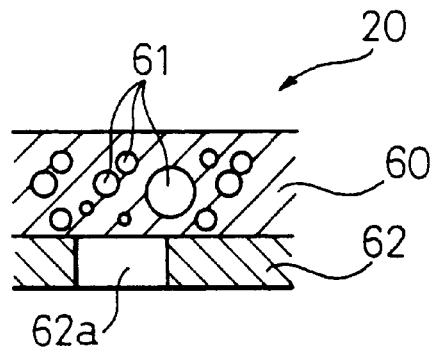
FIG. 11 is a cross-sectional view showing a portion of the template for mounting metallic balls, according to the third embodiment of the present invention.
Figure 12:
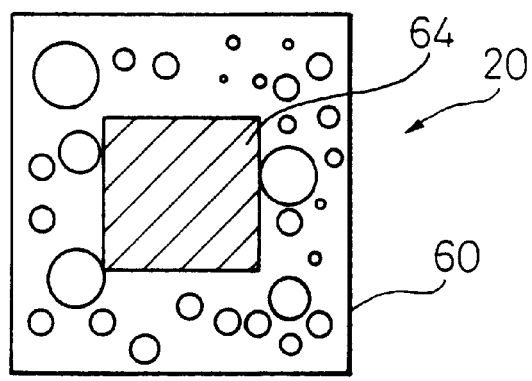
FIG. 12 is a plan view showing the air permeable material layer of the template for mounting metallic balls shown in FIG. 11.
Figure 13:
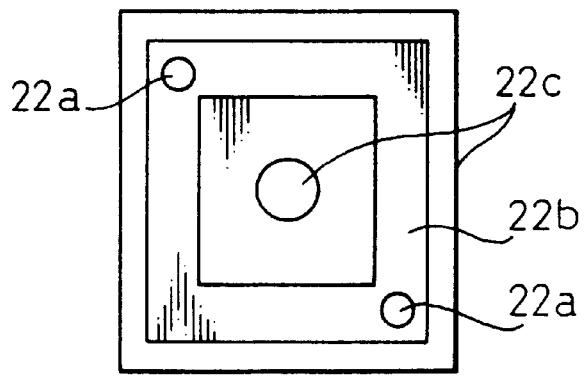
FIG. 13 is a plan view showing the suction head used with the template shown in FIGS. 11 and 12 for mounting metallic balls.

FIGS. 11 to 13 show the third embodiment of the present invention. As shown in FIG. 11, the template 20 comprises an air permeable material layer 60 and a resin layer 62 laminated on each other, and the through-holes (only one shown in FIG. 11) 62a is formed in the resin layer 62. The air permeable material layer 60 and the resin layer 62 are bonded to each other. The air permeable material layer 60 is made of a porous material having a sufficient mechanical strength, or a fibrous material such as glass fiber, so that, air can pass through the air permeable material layer 60. In the structure shown in FIG. 11, the air permeable material layer 60 comprises a plate of a porous material, and fine holes 61 are formed in the plate.

FIG. 12 shows the air permeable material layer 60 of the template 20 for mounting metallic balls. An unpermeable holding member 64 is arranged on the surface of the air permeable material layer 60 at the center thereof on the opposite side to the resin layer 62.

FIG. 13 shows the suction head 22. The suction head 22 includes suction holes 22a, a suction groove 22b, and a plate suction hole 22c. The plate suction hole 22c is arranged at the center of the suction head 22 to attract the holding member 64 provided on the air permeable material layer 60, to thereby attract the entire template 20. The suction groove 22b is formed in the annular shape around the plate suction hole 22c, and the suction holes 22a are open to the inside of the suction groove 22b. The through-holes 62a in the resin layer 62 are arranged in the region of the suction groove 22b.

Accordingly, the mechanical strength of the template 20 comprising the air permeable material layer 60 and the resin layer 62 is sufficiently high, and the metallic balls 16 do not bite into the through-holes 62a, so that it is possible to reliably form metallic bumps on the electronic part, using this template 20 for mounting metallic balls. In this connection, the air permeable material layer 60 and the resin layer 62 may be bonded to each other after the through-holes 62a have been formed, or alternatively the through-hole 62a may be formed after both layers have been bonded to each other.

Figure 14A:
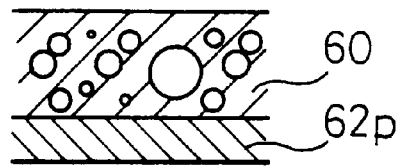
FIGS. 14A to 14C are views showing an example of the manufacturing of the template for mounting metallic balls shown in FIG. 11.
Figure 14B:
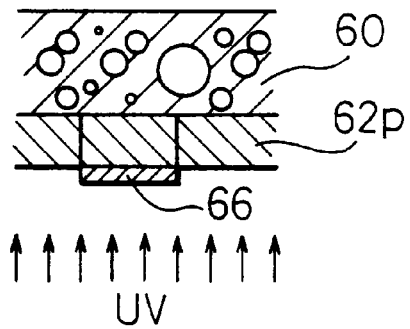
Figure 14C:
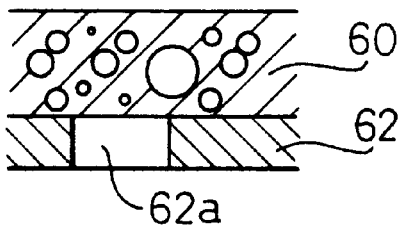

FIGS. 14A to 14C show an example in which the through-holes 62a are formed after the air permeable material layer 60 and the resin layer 62 are bonded onto each other. FIG. 14A shows a state in which the surface of the air permeable material layer 60 is coated or impregnated with an ultraviolet-ray curable resin 62p. FIG. 14B shows a state in which a mask 66 is formed on the ultraviolet-ray curable resin 62p at positions where the through-holes 62a are to be formed and the ultraviolet-ray curable resin 62p is irradiated with ultraviolet rays (UV). FIG. 14C shows a state in which an unmasked portion of the ultraviolet-ray curable resin 62p exposed to ultraviolet-rays is hardened, and a masked portion of the ultraviolet-ray curable resin 62p not exposed to ultraviolet-rays is not hardened, the unhardened portion being removed by solvent, so that the resin layer 62 having the through-holes 62a is formed.

Figure 15:
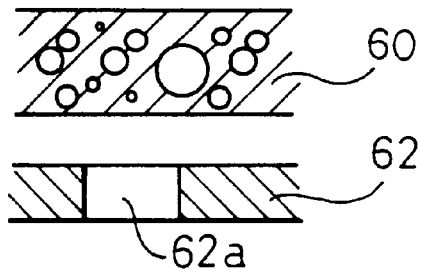
FIG. 15 is a view showing another example of the manufacturing of the template for mounting metallic balls shown in FIG. 11.

FIG. 15 shows an example in which the air permeable material layer 60 and the resin layer 62 are bonded onto each other after the through-holes 62a have been formed in the resin layer 62.

According to the present invention, it is possible to provide a template for mounting metallic balls, having through-holes, the surfaces of which are smooth and no burr is caused on the surface. Therefore, metallic bumps can be easily and reliably formed on the electronic part. Further, the reliability of the connecting sections can be enhanced, and the structure of the metallic bump forming apparatus and also the structure of the electronic part joining machine can be simplified. Furthermore, quality and productivity of the metallic bumps can be enhanced by the present invention.

What is claimed is:

1. A method of forming bumps onto a chip having electrodes, said method comprising the steps of:
using a template having through-holes with smoothed side walls formed corresponding to the electrodes of the chip, to attract conductive balls to be formed into bumps to the template at the through-holes by vacuum suction, said template having first and second opposite surfaces, said through-holes having first end openings at said first surface and second end openings at said second surface, said conductive balls being attracted to said first end openings while the template is being used, said first end openings having a size smaller than a size of the conductive balls to be attracted; positioning the conductive balls attracted by the template to the electrodes; pressing the conductive balls against the electrodes by the template; and releasing vacuum suction.

2. A method according to claim 1, further comprising the step of forming said template before said using step, said forming step comprising forming through-holes in a plate for constituting said template, and smoothing side walls of said through-holes.

3. A method according to claim 2, wherein said smoothing step comprises laser irradiation.

4. A method according to claim 3, wherein said laser irradiation uses a mask having openings slightly greater than openings of said plate.

5. A method according to claim 4, wherein a difference between a size of openings of said mask and a size of openings of said openings of said plate is approximately 2 µm.

6. A method according to claim 2, wherein said step of forming through-holes comprises etching.

7. A method according to claim 1, wherein each of said through-holes has a generally uniform shape from said first end opening to said second end opening.

8. A method according to claim 4, wherein each of said through-holes has a generally constantly changing shape, said first end opening being smaller than said second end opening.

9. A method according to claim 4, wherein said conductive balls are attracted at said first end openings while the template is being used, without any surrounding element around each of said conductive balls.

* * * * *